(12) United States Patent
Yoshida

(10) Patent No.: US 12,520,421 B2
(45) Date of Patent: Jan. 6, 2026

(54) FLEXIBLE BOARD, LIQUID JET HEAD, AND LIQUID JET RECORDING DEVICE

(71) Applicant: SII Printek Inc., Chiba (JP)

(72) Inventor: Kensuke Yoshida, Chiba (JP)

(73) Assignee: SII PRINTEK, INC., Chiba (JP)

( * ) Notice: Subject to any disclaimer, the term of this patent is extended or adjusted under 35 U.S.C. 154(b) by 161 days.

(21) Appl. No.: 18/387,184

(22) Filed: Nov. 6, 2023

(65) Prior Publication Data
US 2024/0179836 A1    May 30, 2024

(30) Foreign Application Priority Data

Nov. 29, 2022   (JP) ................................ 2022-190197

(51) Int. Cl.
*H05K 1/02* (2006.01)
*B41J 2/045* (2006.01)

(52) U.S. Cl.
CPC ........ *H05K 1/0298* (2013.01); *B41J 2/04541* (2013.01); *B41J 2/04548* (2013.01); *B41J 2/04581* (2013.01); *H05K 1/028* (2013.01)

(58) Field of Classification Search
CPC ... H05K 1/0298; H05K 1/028; B41J 2/04541; B41J 2/04548; B41J 2/04581; B41J 2002/14491; B41J 2/14201; B41J 2/01
See application file for complete search history.

(56) References Cited

U.S. PATENT DOCUMENTS

| | | | |
|---|---|---|---|
| 2011/0205270 A1* | 8/2011 | Miyata | B41J 2/14233 347/54 |
| 2011/0205308 A1 | 8/2011 | Miyata | |
| 2011/0273497 A1* | 11/2011 | Yamamoto | B41J 2/155 347/9 |

FOREIGN PATENT DOCUMENTS

JP           2011-167956 A           9/2011

OTHER PUBLICATIONS

B4 Extended European Search Report in Europe Application No. 23211707.7 dated Apr. 10, 2024, 8 pages.

* cited by examiner

*Primary Examiner* — Bradley W Thies
(74) *Attorney, Agent, or Firm* — Crowell & Moring LLP

(57) ABSTRACT

A flexible board includes a first and second wiring layers opposed to each other along a direction perpendicular to a board surface of the flexible board, at least one drive device arranged on the first wiring layer, an individual wiring region arranged in the first wiring layer, including a plurality of individual wiring lines, a common wiring region arranged in the second wiring layer, including at least one common wiring line, a pressure-bonding electrode part arranged closed to the jet section side than the individual wiring region and the common wiring region, including a plurality of pressure-bonding electrodes electrically coupled individually to the plurality of individual wiring lines and the at least one common wiring line, and an overlap region in which at least a part of the individual wiring region and at least a part of the common wiring region overlap each other in the board surface.

11 Claims, 10 Drawing Sheets

FLEXIBLE BOARD, LIQUID JET HEAD, AND LIQUID JET RECORDING DEVICE

RELATED APPLICATIONS

This application claims priority to Japanese Patent application No. JP2022-190197 filed on Nov. 29, 2022, the entire content of which is incorporated herein by reference.

BACKGROUND OF THE INVENTION

1. Field of the Invention

The present disclosure relates to a flexible board, a liquid jet head, and a liquid jet recording device.

2. Description of the Related Art

Liquid jet recording devices equipped with liquid jet heads are used in a variety of fields, and a variety of types of liquid jet heads have been developed (see, e.g., JP-A-2011-167956).

In such a liquid jet head, in general, it is required to improve the reliability.

It is desirable to provide a flexible board, a liquid jet head, and a liquid jet recording device capable of improving the reliability.

SUMMARY OF THE INVENTION

The flexible board according to an embodiment of the present disclosure is a flexible board configured to output a drive signal to be applied to a liquid jet head having a jet section, the flexible board including a first wiring layer and a second wiring layer opposed to each other along a direction perpendicular to a board surface of the flexible board, at least one drive device which is arranged on the first wiring layer, and which is configured to generate the drive signal configured to jet liquid from the jet section, an individual wiring region which is arranged in the first wiring layer, and which includes a plurality of individual wiring lines configured to individually transmit the drive signal from the drive device toward a plurality of individual electrodes in the jet section, a common wiring region which is arranged in the second wiring layer, and which includes at least one common wiring line electrically coupled to a common electrode in the jet section, a pressure-bonding electrode part which is arranged closed to the jet section than the individual wiring region and the common wiring region in the board surface, and which includes a plurality of pressure-bonding electrodes electrically coupled individually to the plurality of individual wiring lines and the at least one common wiring line, and an overlap region in which at least a part of the individual wiring region and at least a part of the common wiring region overlap each other in the board surface.

A liquid jet head according to an embodiment of the present disclosure includes the flexible board according to an embodiment of the present disclosure described above, and the jet section configured to jet the liquid based on the drive signal output from the flexible board.

A liquid jet recording device according to an embodiment of the present disclosure includes the liquid jet head according to the embodiment of the present disclosure.

According to the flexible board, the liquid jet head, and the liquid jet recording device related to an embodiment of the present disclosure, it becomes possible to improve the reliability.

DETAILED DESCRIPTION OF THE PREFERRED EMBODIMENTS

An embodiment of the present disclosure will hereinafter be described in detail with reference to the drawings. It should be noted that the description will be presented in the following order:

1. Embodiment (an example of a flexible board having a variety of shapes of overlap regions)
2. Modified Examples
    Modified Example 1 (an example when a part of an individual wiring region is not the overlap region)
    Modified Example 2 (an example when a flexible board is configured using a mounting board and a relay board)
3. Other Modified Examples

1. Embodiment

[Outline Configuration of Printer 5]

Figure 1:
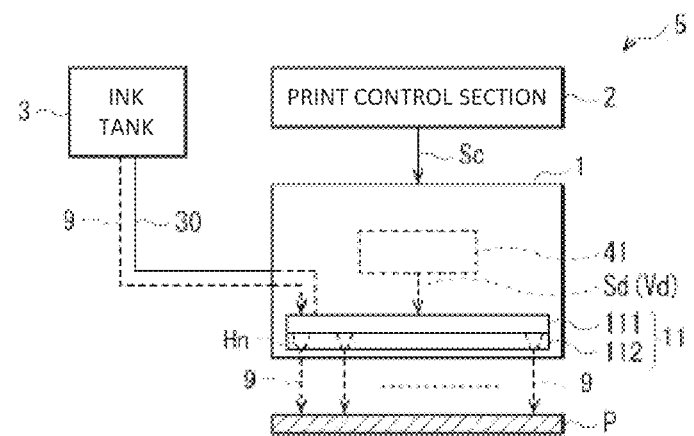
FIG. 1 is a block diagram showing an outline configuration example of a liquid jet recording device according to an embodiment of the present disclosure.
Figure 2:
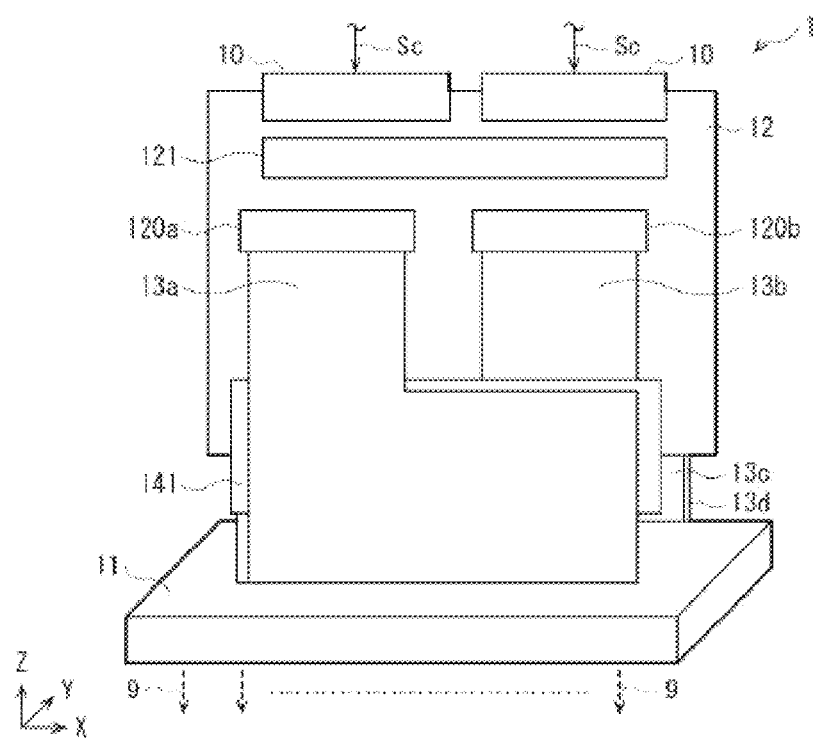
FIG. 2 is a perspective view schematically showing an outline configuration example of a liquid jet head shown in FIG. 1.
Figure 3:
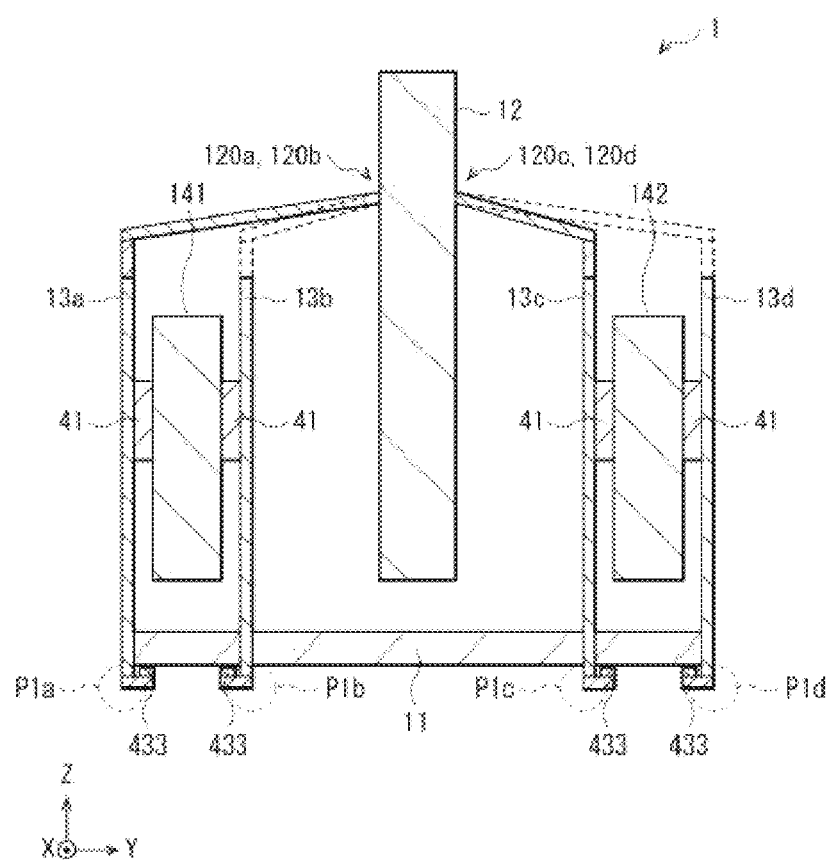
FIG. 3 is a cross-sectional view schematically showing a configuration example of the liquid jet head shown in FIG. 2.

FIG. 1 is a block diagram showing an outline configuration example of a printer 5 as a liquid jet recording device according to an embodiment of the present disclosure. FIG. 2 is a perspective view schematically showing an outline configuration example of an inkjet head 1 as a liquid jet head shown in FIG. 1. FIG. 3 is a cross-sectional view (a Y-Z cross-sectional view) schematically showing a configuration example of the inkjet head 1 shown in FIG. 2. It should be noted that a scale size of each of the members is accordingly altered so that the member is shown in a recognizable size in the drawings used in the description of the present specification.

The printer 5 is an inkjet printer for performing recording (printing) of images, characters, and the like on a recording target medium (e.g., recording paper P shown in FIG. 1) using ink 9 described later. As shown in FIG. 1, the printer 5 is provided with the inkjet head 1, a print control section 2, and an ink tank 3.

It should be noted that the inkjet head 1 corresponds to a specific example of a "liquid jet head" in the present disclosure, and the printer 5 corresponds to a specific example of a "liquid jet recording device" in the present disclosure. Further, the ink 9 corresponds to a specific example of a "liquid" in the present disclosure.

(A. Print Control Section 2)

The print control section 2 is for supplying the inkjet head 1 with a variety of types of information (data). Specifically, as shown in FIG. 1, the print control section 2 is arranged to supply each of constituents (drive devices 41 described later and so on) in the inkjet head 1 with a print control signal Sc. It should be noted that the print control signal Sc is arranged to include, for example, image data, an ejection timing signal, and a power-supply voltage for making the inkjet head 1 operate.

(B. Ink Tank 3)

The ink tank 3 is a tank for containing the ink 9 inside. As shown in FIG. 1, the ink 9 in the ink tank 3 is arranged to be supplied to the inside (a jet section 11 described later) of the inkjet head 1 via an ink supply tube 30. It should be noted that such an ink supply tube 30 is formed of, for example, a flexible hose having flexibility.

(C. Inkjet Head 1)

The inkjet head 1 is a head for jetting (ejecting) the ink 9 shaped like a droplet from a plurality of nozzle holes Hn described later to the recording paper P as represented by dotted arrows in FIG. 1 to thereby perform recording of images, characters, and so on. As shown in, for example, FIG. 2 and FIG. 3, the inkjet head 1 is provided with the single jet section 11, a single I/F (interface) board 12, four flexible boards 13*a*, 13*b*, 13*c*, and 13*d*, and two cooling units 141, 142.

(C-1. I/F Board 12)

As shown in FIG. 2 and FIG. 3, the I/F board 12 is provided with two connectors 10, four connectors 120*a*, 120*b*, 120*c*, and 120*d*, and a circuit arrangement region 121.

As shown in FIG. 2, the connectors 10 are each a part (a connector part) for inputting the print control signal Sc which is described above, and which is supplied from the print control section 2 toward the inkjet head 1 (the flexible boards 13*a*, 13*b*, 13*c*, and 13*d* described later). The connectors 120*a*, 120*b*, 120*c*, and 120*d* are parts (connector parts) for electrically coupling the I/F board 12 and the flexible boards 13*a*, 13*b*, 13*c*, and 13*d*, respectively.

The circuit arrangement region 121 is a region where a variety of circuits are arranged on the I/F board 12. It should be noted that it is also possible to arrange that such a circuit arrangement region is also disposed in other regions on the I/F board 12.

(C-2. Jet Section 11)

As shown in FIG. 1, the jet section 11 is a part which has the plurality of nozzle holes Hn, and which jets the ink 9 from these nozzle holes Hn. Such jet of the ink 9 is arranged to be performed in accordance with drive signals Sd (drive voltages Vd) supplied from the drive devices 41 described later on each of the flexible boards 13*a*, 13*b*, 13*c*, and 13*d* (see FIG. 1).

As shown in FIG. 1, such a jet section 11 is configured including an actuator plate 111 and a nozzle plate 112.

(Nozzle Plate 112)

The nozzle plate 112 is a plate formed of a film material such as polyimide, or a metal material, and has the plurality of nozzle holes Hn described above as shown in FIG. 1. These nozzle holes Hn are formed side by side at predetermined intervals, and each have, for example, a circular shape.

Specifically, in the example of the jet section 11 shown in FIG. 2, the jet section 11 is constituted by a plurality of nozzle arrays (four nozzle arrays) each of which has the plurality of nozzle holes Hn in the nozzle plate 112 arranged along an array direction (an X-axis direction). Further, these four nozzle arrays are arranged side by side along a direction (a Y-axis direction) perpendicular to the array direction.

(Actuator Plate 111)

The actuator plate 111 is a plate formed of a piezoelectric material such as PZT (lead zirconate titanate). The actuator plate 111 is provided with a plurality of channels (pressure chambers). These channels are each a part for applying pressure to the ink 9, and are arranged side by side so as to be parallel to each other at predetermined intervals. Each of the channels is partitioned with drive walls (not shown) formed of a piezoelectric body, and forms a groove part having a recessed shape in a cross-sectional view.

As such channels, there exist ejection channels for ejecting the ink 9, and dummy channels (non-ejection channels) which do not eject the ink 9. In other words, it is arranged that the ejection channels are filled with the ink 9 on the one hand, but the dummy channels are not filled with the ink 9 on the other hand. It should be noted that it is arranged that filling of each of the ejection channels with the ink 9 is performed via, for example, a flow channel (a common flow channel) commonly communicated with such ejection channels. Further, it is arranged that each of the ejection channels is individually communicated with the nozzle hole Hn in the nozzle plate 112 on the one hand, but each of the dummy channels is not communicated with the nozzle hole Hn on the other hand. These ejection channels and the dummy channels are alternately arranged side by side along the array direction (the X-axis direction) described above.

Further, on the inner side surfaces opposed to each other in the drive walls described above, there are respectively disposed drive electrodes. As the drive electrodes, there exist common electrodes disposed on the inner side surfaces facing the ejection channels, and active electrodes (individual electrodes) disposed on the inner side surfaces facing the dummy channels. These drive electrodes and the drive devices 41 described later are electrically coupled to each other via each of the flexible boards 13*a*, 13*b*, 13*c*, and 13*d*. Thus, it is arranged that the drive voltages Vd (the drive signals Sd) described above are applied to the drive electrodes from the drive devices 41 via each of the flexible boards 13*a*, 13*b*, 13*c*, and 13*d* (see FIG. 1).

(C-3. Flexible Boards 13*a*, 13*b*, 13*c*, and 13*d*)

The flexible boards 13*a*, 13*b*, 13*c*, and 13*d* are each a board for electrically coupling the I/F board 12 and the jet section 11 to each other as shown in FIG. 2 and FIG. 3. These flexible boards 13*a*, 13*b*, 13*c*, and 13*d* are arranged to individually control the jet actions of the ink 9 in the four nozzle arrays in the nozzle plate 112 described above, respectively. Further, as indicated by the reference symbols P1*a*, P1*b*, P1*c*, and P1*d* in, for example, FIG. 3, it is arranged that the flexible boards 13*a*, 13*b*, 13*c*, and 13*d* are folded around places (around pressure-bonding electrode parts 433) where the flexible boards 13*a*, 13*b*, 13*c*, and 13*d* are coupled to the jet section 11, respectively. It should be noted that it is arranged that electrical coupling between the pressure-bonding electrode parts 433 and the jet section 11 is achieved by, for example, thermocompression bonding using an ACF (Anisotropic Conductive Film).

On each of such flexible boards 13a, 13b, 13c, and 13d (on a first wiring layer at an obverse surface S1 side described later), there is individually mounted the drive devices 41 (see FIG. 3). These drive devices 41 are each a device for outputting the drive signals Sd (the drive voltages Vd) for jetting the ink 9 from the nozzle holes Hn in the corresponding nozzle array in the jet section 11. Therefore, such drive signals Sd are arranged to be output from each of the flexible boards 13a, 13b, 13c, and 13d to the jet section 11. It should be noted that such drive devices 41 are each formed of, for example, an ASIC (Application Specific Integrated Circuit).

Further, these drive devices 41 are arranged to be cooled by the cooling units 141, 142 described above. Specifically, as shown in FIG. 3, the cooling unit 141 is fixedly arranged between the drive devices 41 on the flexible boards 13a, 13b, and by pressing the cooling unit 141 against each of these drive devices 41, the drive devices 41 are cooled. Similarly, the cooling unit 142 is fixedly arranged between the drive devices 41 on the flexible boards 13c, 13d, and by pressing the cooling unit 142 against each of these drive devices 41, the drive devices 41 are cooled. It should be noted that such cooling units 141, 142 can each be configured using a variety of types of cooling mechanisms.

[Detailed Configuration of Flexible Boards 13a, 13b, 13c, and 13d]

Subsequently, a detailed configuration example of the flexible boards 13a, 13b, 13c, and 13d described above will be described with reference to FIG. 4 and FIG. 5 in addition to FIG. 1 through FIG. 3.

Figure 4:
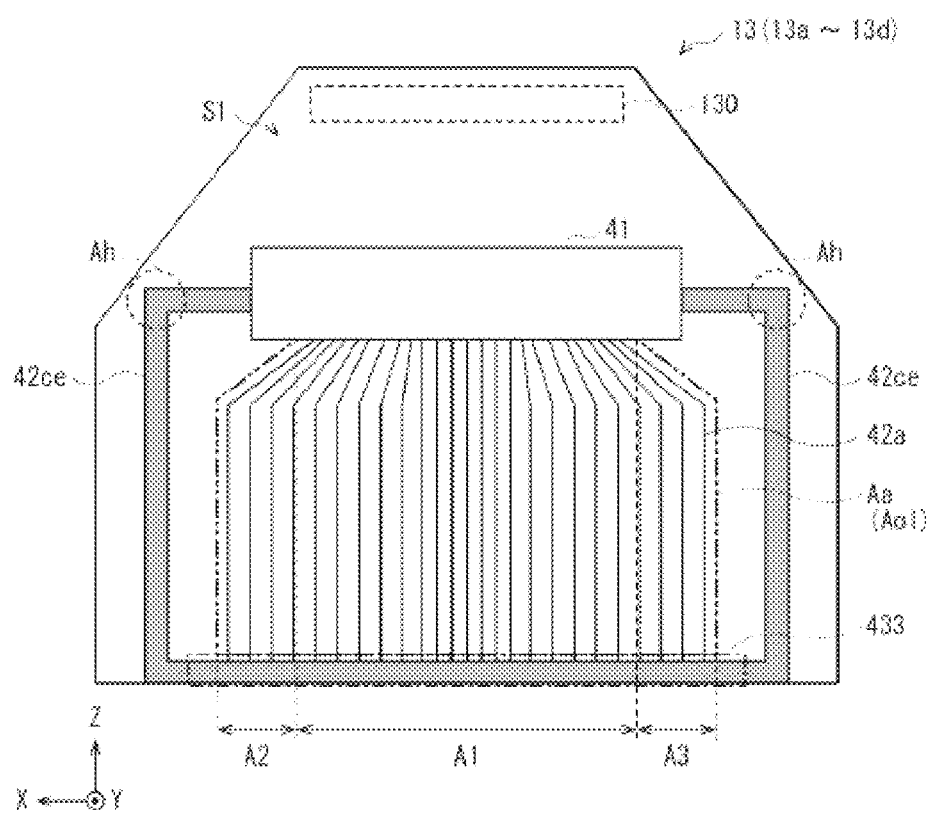
FIG. 4 is a plan view schematically showing a configuration example of an obverse surface side in a flexible board shown in FIG. 2 and FIG. 3.
Figure 5:
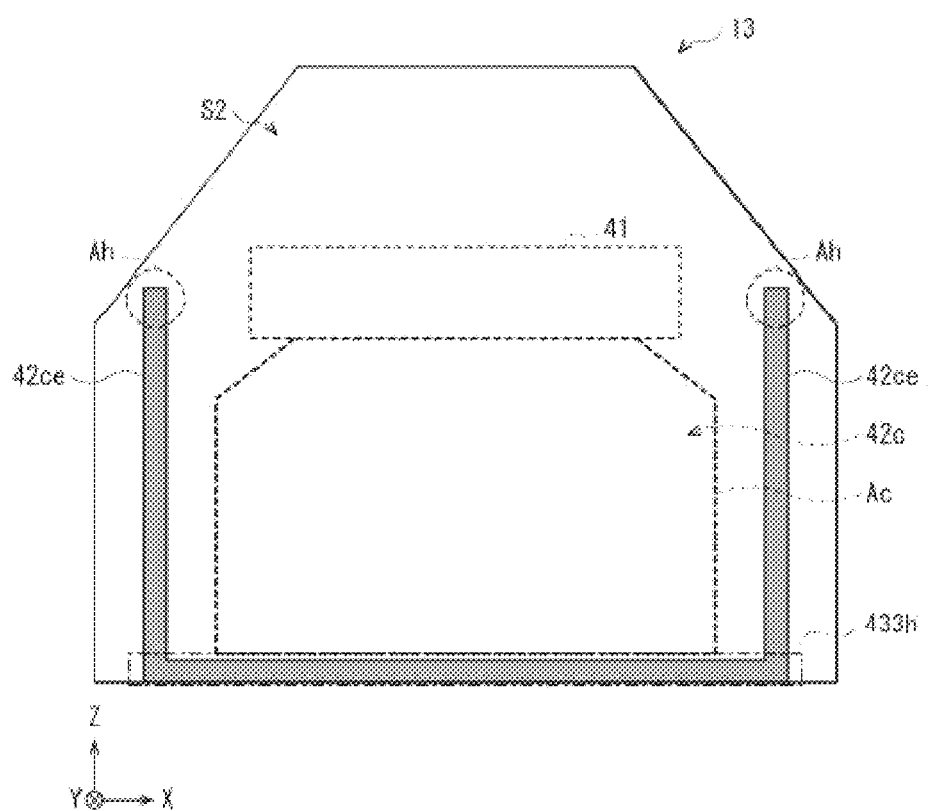
FIG. 5 is a plan view schematically showing a configuration example of a reverse surface side in the flexible board shown in FIG. 2 and FIG. 3.

FIG. 4 and FIG. 5 are plan views (Z-X plane views) schematically showing a detailed configuration example of the flexible boards 13a through 13d (the flexible boards 13) shown in FIG. 2 and FIG. 3. Specifically, FIG. 4 is a plan view (a Z-X plane view) schematically showing a configuration example at the obverse surface S1 side in the flexible boards 13. Further, FIG. 5 is a plan view (a Z-X plane view) schematically showing a configuration example at the reverse surface S2 side in the flexible boards 13.

First, the flexible boards 13 are each formed as a double-sided board having a multilayer structure (a double-layered structure in the example shown in FIG. 4 and FIG. 5) including the obverse surface S1 and the reverse surface S2 described above. Specifically, the flexible boards 13 each have a first wiring layer at the obverse surface S1 side and a second wiring layer at the reverse surface S2 side opposed to each other along a direction (the Y-axis direction) perpendicular to a board surface (a Z-X plane) as wiring layers of such a double-layered structure. In other words, in the example shown in FIG. 4 and FIG. 5, the first wiring layer and the second wiring layer are arranged adjacent to each other along the direction (the Y-axis direction) perpendicular to the board surface.

It should be noted that it is possible to adopt a structure in which the wiring layers in the flexible board 13 are, for example, three or more layers including the first wiring layer and the second wiring layer described above. Also in this case, it is desirable for the first wiring layer and the second wiring layer to be arranged adjacent to each other along the direction (the Y-axis direction) perpendicular to the board surface.

Further, as shown in FIG. 4 and FIG. 5, each of the flexible boards 13 further has coupling electrodes 130, an individual wiring region Aa including a plurality of individual wiring lines 42a, a common wiring region Ac including a single common wiring line 42c or a plurality of wiring lines 42c, end portion common wiring lines 42ce, and the pressure-bonding electrode part 433 described above.

The coupling electrodes 130 are arranged (see FIG. 4) in an end-portion region at the I/F board 12 side in the obverse surface S1 of each of the flexible boards 13, and are electrodes for electrically coupling each of the flexible boards 13 and the I/F board 12 to each other.

As shown in FIG. 4, the individual wiring region Aa is a region which is arranged at the obverse surface S1 side of each of the flexible boards 13, and which includes the plurality of individual wiring lines 42a. The individual wiring region Aa has a substantially rectangular shape (a trapezoidal shape) in the example shown in FIG. 4, and has a central region A1, and end-portion regions A2, A3 located at both end sides of the central region A1 along a longitudinal direction (the X-axis direction) of the individual wiring region Aa. Further, the plurality of individual wiring lines 42a described above is arranged side by side along the longitudinal direction (the X-axis direction) of the drive device 41, and is arranged to individually transmit the drive signals Sd from the drive device 41 toward the plurality of individual electrodes described above inside the jet section 11.

As shown in FIG. 5, the common wiring region Ac is a region which is arranged at the reverse surface S2 side of each of the flexible boards 13, and which includes the single common wiring line 42c or the plurality of common wiring lines 42c. The common wiring region Ac also has the substantially rectangular shape (the trapezoidal shape) in the example shown in FIG. 5, and the area SAc of the common wiring region Ac is made larger than the area SAa of the individual wiring region Aa described above (SAc>SAa) in the example shown in FIG. 5. Further, the single common wiring line 42c or the plurality of common wiring lines 42c described above is electrically coupled to the common electrode described above in the jet section 11. It should be noted that the details of the configuration example of such a common wiring region Ac will be described later (Practical Examples 1 through 4; FIG. 6 through FIG. 9).

The end portion common wiring lines 42ce are each a wiring line electrically coupled to the single common wiring line 42c or the plurality of common wiring lines 42c described above. As shown in FIG. 4 and FIG. 5, the end portion common wiring lines 42ce are respectively arranged in regions (end-portion regions) at both ends along the longitudinal direction (the X-axis direction) of the drive device 41 at both of the obverse surface S1 side and the reverse surface S2 side in each of the flexible boards 13. Specifically, the end portion common wiring lines 42ce at the both ends extend along a direction (the Z-axis direction) along a shorter dimension of the drive device 41 respectively at the obverse surface S1 side and the reverse surface S2 side of each of the flexible boards 13. Further, the end portion common wiring line 42ce at the obverse surface S1 side and the end portion common wiring line 42ce at the reverse surface S2 side are electrically coupled to each other in through hole regions Ah (see FIG. 4 and FIG. 5). It should be noted that it is also possible to arrange that through holes for performing the electrical coupling of the obverse surface S1 side and the reverse surface S2 side are disposed besides the through hole regions Ah on the end portion common wiring lines 42ce.

As shown in FIG. 4, the pressure-bonding electrode part 433 is arranged closed to the jet section 11 than the individual wiring region Aa and the common wiring region Ac described above in the board surface of each of the flexible boards 13. It should be noted that an arrangement region of the pressure-bonding electrode part 433 is made different from an overlap region Aol described below (see FIG. 4). The pressure-bonding electrode part 433 includes a plurality of pressure-bonding electrodes electrically coupled individually to the plurality of individual wiring lines 42a and the single common wiring line 42c or the plurality of common wiring lines 42c described above. Further, it is arranged that the end portion common wiring lines 42ce described above and the common electrode described above are electrically coupled to each other in a through hole region 433h (see FIG. 5) in the pressure-bonding electrode part 433. It is arranged that the drive signals Sd transmitted from the drive device 41 via the individual wiring lines 42a are supplied from the flexible board 13 toward the jet section 11 via the pressure-bonding electrodes in such a pressure-bonding electrode part 433.

Here, in the flexible board 13 according to the present embodiment, as shown in FIG. 4 and FIG. 5, at least a part of the individual wiring region Aa described above and at least a part of the common wiring region Ac described above overlap each other in the overlap region Aol in the board surface. Further, in the example shown in FIG. 4 and FIG. 5, the overlap region Aol is arranged so as to include at least the central region A1 described above in the board surface of the flexible board 13. Specifically, in the example shown in FIG. 4 and FIG. 5, the overlap region Aol is arranged so as to include the central region A1, and the end-portion regions A2, A3 described above. Further, in the example shown in FIG. 4 and FIG. 5, as described above, the area SAc of the common wiring region Ac is made larger than the area SAa of the individual wiring region Aa (SAc>SAa), and at the same time, the entire area of the individual wiring region Aa is the overlap region Aol described above. Further, in the flexible board 13, for example, the total area Stc (a total value of the areas of the single common wiring line 42c or the plurality of common wiring lines 42c) of the common wiring lines 42c in the common wiring region Ac is made no smaller than the total area Sta (a total value of the areas of the plurality of individual wiring lines 42a) of the individual wiring lines 42a in the individual wiring region Aa (Stc≥Sta).

Practical Example Related to Common Wiring Region Ac and Overlap Region Aol

Here, practical examples (Practical Example 1 through 4) related to the common wiring region Ac and the overlap region Aol described above will be described in detail with reference to FIG. 6 through FIG. 9 in addition to FIG. 1 through FIG. 5.

Figure 6:
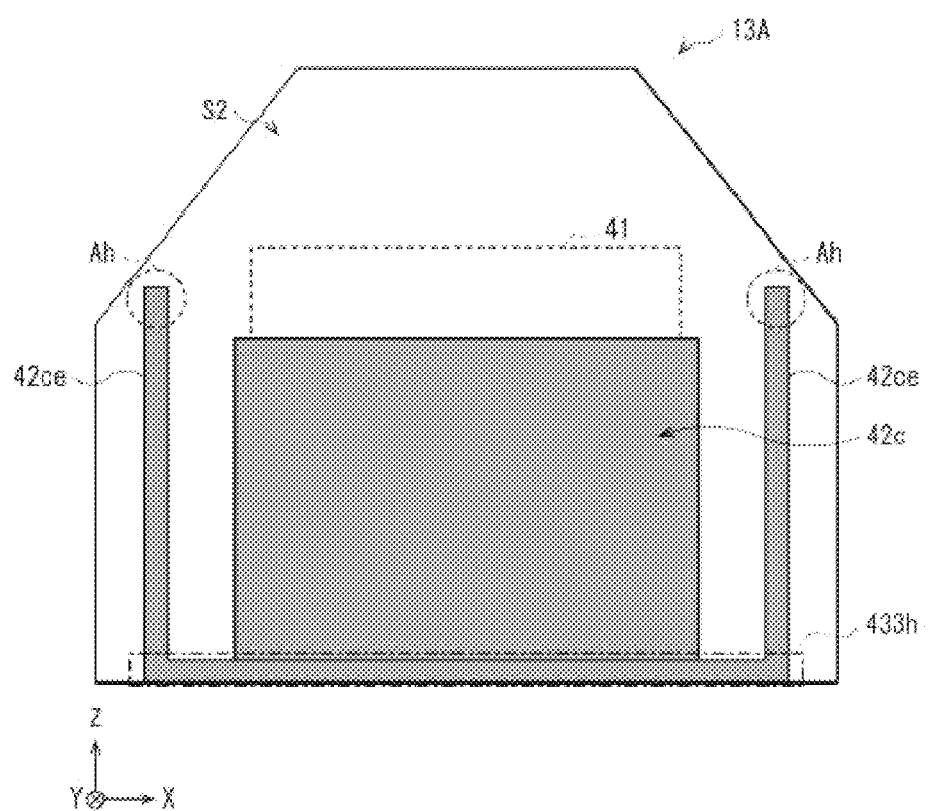
FIG. 6 is a plan view schematically showing a configuration example of a common wiring region and so on related to Practical Example 1.
Figure 7:
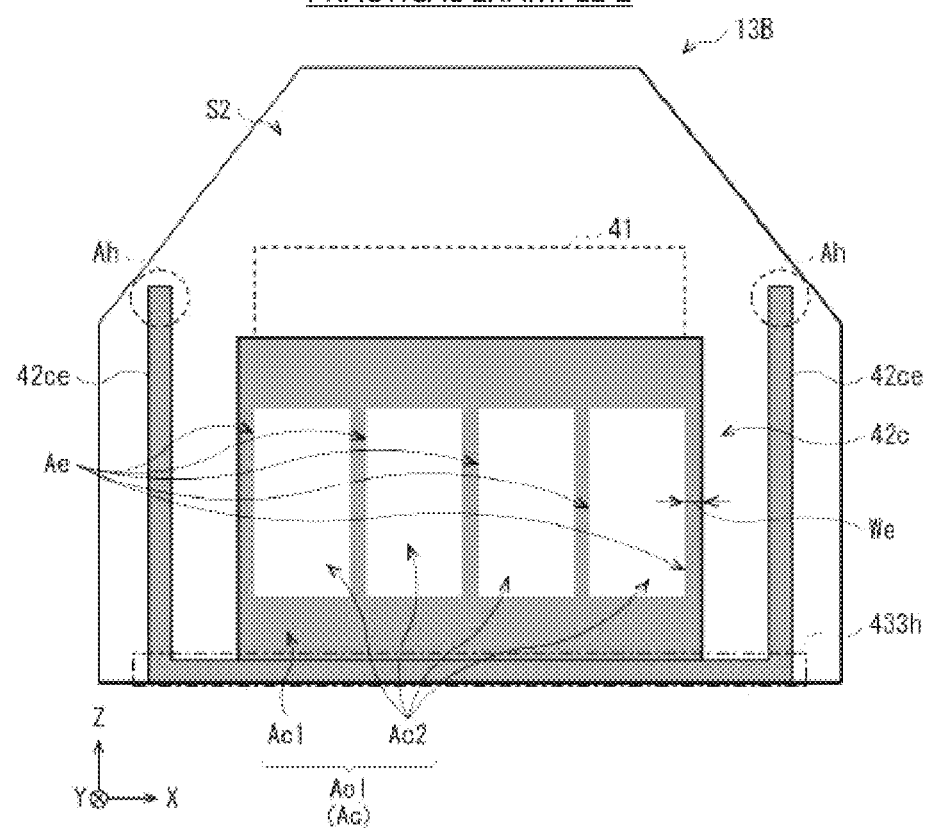
FIG. 7 is a plan view schematically showing a configuration example of a common wiring region and so on related to Practical Example 2.
Figure 8:
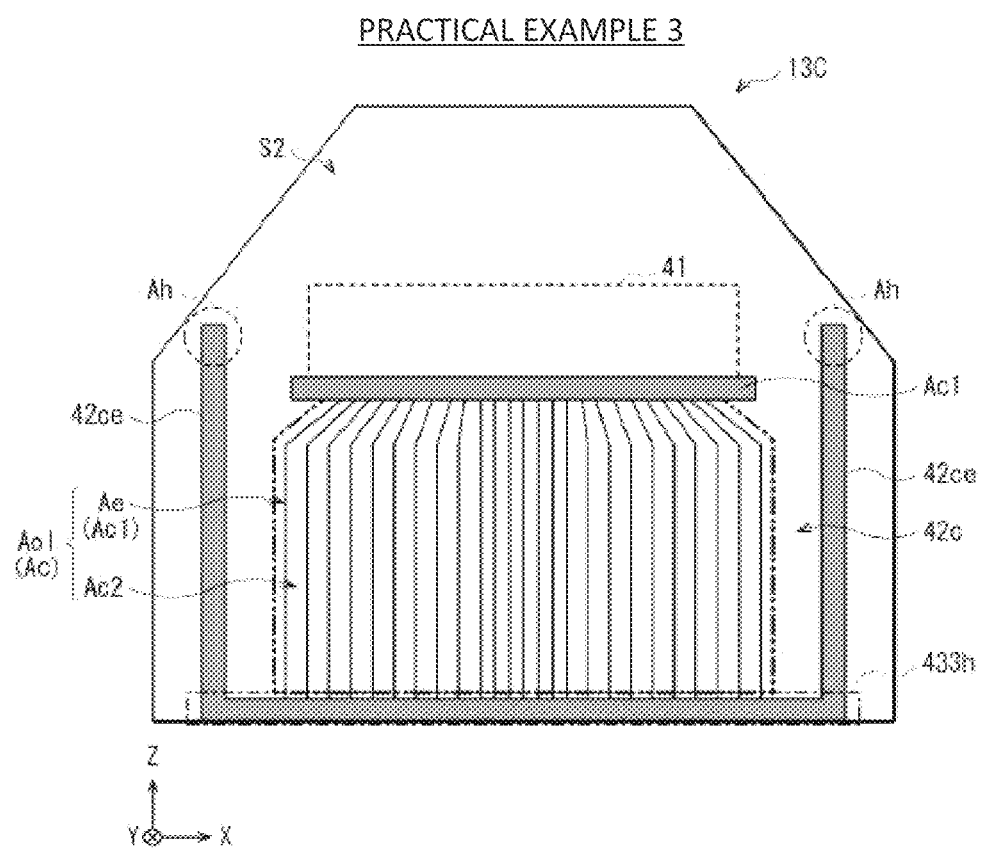
FIG. 8 is a plan view schematically showing a configuration example of a common wiring region and so on related to Practical Example 3.
Figure 9:
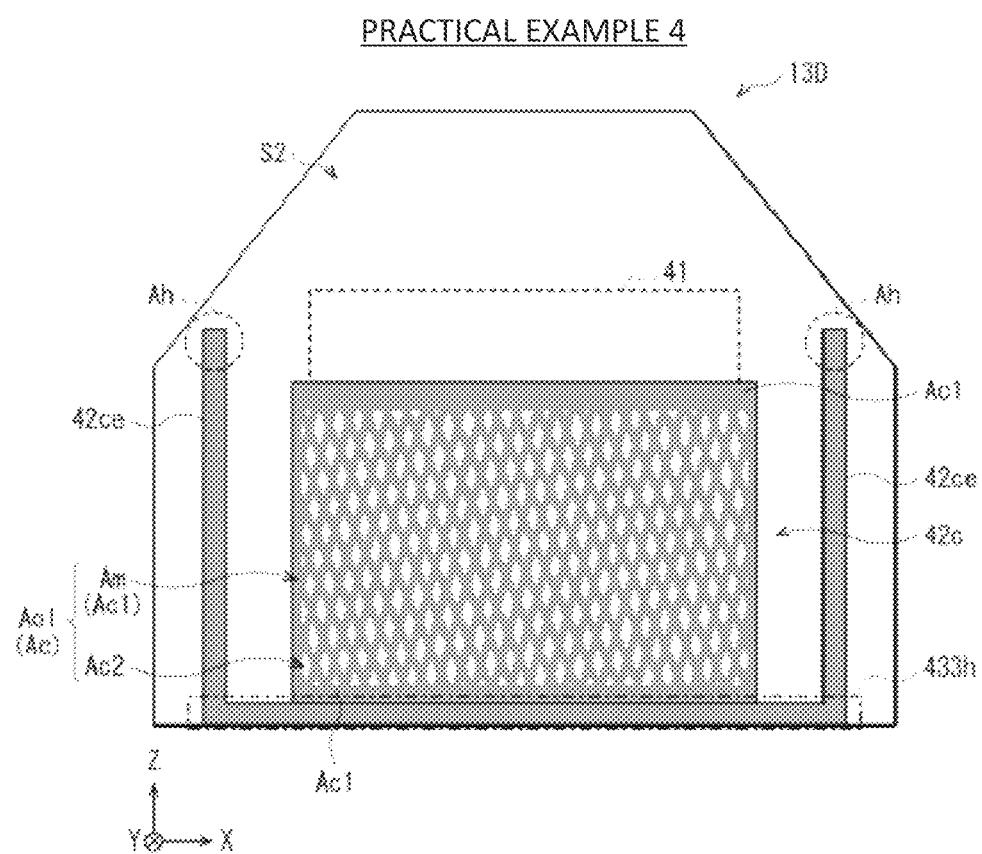
FIG. 9 is a plan view schematically showing a configuration example of a common wiring region and so on related to Practical Example 4.

FIG. 6 through FIG. 9 are plan views (Z-X plane views) schematically showing configuration examples (configuration examples at the reverse surface S2 side) of the common wiring region Ac and the overlap region Aol related to Practical Examples 1 through 4, respectively. Specifically, FIG. 6 shows the configuration example of the common wiring region Ac and the overlap region Aol in a flexible board 13A according to Practical Example 1, and FIG. 7 shows the configuration example of the common wiring region Ac and the overlap region Aol in a flexible board 13B according to Practical Example 2. Similarly, FIG. 8 shows the configuration example of the common wiring region Ac and the overlap region Aol in a flexible board 13C according to Practical Example 3, and FIG. 9 shows the configuration example of the common wiring region Ac and the overlap region Aol in a flexible board 13D according to Practical Example 4.

Practical Example 1

First, in the flexible board 13A according to Practical Example 1 shown in FIG. 6, the overlap region Aol in the common wiring region Ac has only the arrangement region of the common wiring line 42c (the entire area of the common wiring region Ac is the arrangement region of the common wiring line 42c). In other words, in the overlap region Aol of Practical Example 1, the common wiring line 42c is formed of a so-called "solid wiring line." In other words, in Practical Example 1 described above, there is created the state in which the individual wiring region Aa (see FIG. 4) completely overlaps the common wiring line 42c.

Practical Example 2

In contrast, in the flexible board 13B according to Practical Example 2 shown in FIG. 7, unlike the flexible board 13A according to Practical Example 1, the overlap region Aol in the common wiring region Ac has an arrangement region Ac1 of the common wiring line 42c and non-arrangement regions Ac2 of the common wiring line 42c. Further, in Practical Example 2 described above, the arrangement region Ac1 of the common wiring line 42c includes a plurality of extending regions Ae which extends along an extension direction (the Z-axis direction) of the individual wiring lines 42a shown in FIG. 4, and which is arranged side by side along the longitudinal direction (the X-axis direction) of the drive device 41. Specifically, in the example shown in FIG. 7, there are disposed the five extending regions Ae arranged side by side along the X-axis direction.

It should be noted that as the shape of such an extending region Ae, it is possible to adopt a shape including, for example, a curved line besides, for example, polygonal shapes (a triangular shape, a quadrangular shape, a hexagonal shape, a trapezoidal shape, and so on). Further, it can be said that the more the number of the extending regions Ae increases, the better an electrical return path described later becomes, and therefore, the more desirable.

Further, in Practical Example 2 shown in FIG. 7 described above, unlike the case of Practical Example 3 (FIG. 8) described below, the number (five in the example shown in FIG. 7) of the extending regions Ae described above is made smaller than the number (see FIG. 4) of the individual wiring lines 42a. Further, in Practical Example 2 described above, a total width (a total value of the width We of the extending regions Ae) along the X-axis direction (the longitudinal direction of the drive device 41) in the plurality of extending regions Ae is made larger than a total width along the X-axis direction in the plurality of individual wiring lines 42a.

Practical Example 3

In the flexible board 13C according to Practical Example 3 shown in FIG. 8, first, similarly to the flexible board 13B according to Practical Example 2, the overlap region Aol in the common wiring region Ac has an arrangement region Ac1 of the common wiring line 42c and non-arrangement regions Ac2 of the common wiring line 42c. Further, also in Practical Example 3 described above, similarly to Practical Example 2, the arrangement region Ac1 of the common wiring line 42c includes the plurality of extending regions Ae described above.

It should be noted that in Practical Example 3, unlike Practical Example 2, the number of the extending regions Ae is made equal to the number (see FIG. 4) of the individual wiring lines 42a. In other words, the plurality of extending regions Ae included in the common wiring region Ac and the plurality of individual wiring lines 42a make complete pairs in a one-to-one relationship. Further, in Practical Example 3 described above, the plurality of extending regions Ae is arranged to include regions individually overlapping the plurality of individual wiring lines 42a as the overlap region Aol.

Practical Example 4

Also in the flexible board 13D according to Practical Example 4 shown in FIG. 9, similarly to the flexible boards 13B, 13C according to Practical Examples 2 and 3, the overlap region Aol in the common wiring region Ac has an arrangement region Ac1 of the common wiring line 42c and non-arrangement regions Ac2 of the common wiring line 42c.

It should be noted that in Practical Example 4, unlike Practical Examples 2 and 3, the arrangement region Ac1 of the common wiring line 42c includes a region (a net-like region Am) in which the common wiring line 42c is arranged like a net instead of the plurality of extending regions Ae as in Practical Examples 2 and 3. It should be noted that when the net in such a net-like region Am becomes too coarse, the performance as the return path described later degrades, and therefore, it can be said that it is unsuitable when it is desired to dramatically decrease the rigidity in the flexible board 13D.

[Operations and Functions/Advantages]
(A. Basic Operation of Printer 5)

In the printer 5, a recording operation (a printing operation) of images, characters, and so on to the recording target medium (the recording paper P or the like) is performed using such a jet operation of the ink 9 by the inkjet head 1 as described below. Specifically, in the inkjet head 1 according to the present embodiment, the jet operation of the ink 9 using a shear mode is performed in the following manner.

First, the drive devices 41 on each of the flexible boards 13 (13a, 13b, 13c, and 13d) each apply the drive voltages Vd (the drive signals Sd) to the drive electrodes (the common electrodes and the active electrodes) described above in the actuator plate 111 in the jet section 11. Specifically, each of the drive devices 41 applies the drive voltage Vd to the drive electrodes disposed on the pair of drive walls partitioning the ejection channel described above. Thus, the pair of drive walls each deform so as to protrude toward the dummy channel adjacent to the ejection channel.

On this occasion, it results in that the drive wall makes a flexion deformation to have a V shape centering on the intermediate position in the depth direction in the drive wall. Further, due to such a flexion deformation of the drive wall, the ejection channel deforms as if the ejection channel bulges. As described above, due to the flexion deformation caused by a piezoelectric thickness-shear effect in the pair of drive walls, the volume of the ejection channel increases. Further, by the volume of the ejection channel increasing, the ink 9 is induced into the ejection channel as a result.

Subsequently, the ink 9 induced into the ejection channel in such a manner turns to a pressure wave to propagate to the inside of the ejection channel. Then, the drive voltage Vd to be applied to the drive electrodes becomes 0 (zero) V at the timing at which the pressure wave has reached the nozzle hole Hn of the nozzle plate 112 (or timing around that timing). Thus, the drive walls are restored from the state of the flexion deformation described above, and as a result, the volume of the ejection channel having once increased is restored again.

In such a manner, the pressure inside the ejection channel increases in the process that the volume of the ejection channel is restored, and thus, the ink 9 in the ejection channel is pressurized. As a result, the ink 9 shaped like a droplet is ejected (see FIG. 1) toward the outside (toward the recording paper P) through the nozzle hole Hn. The jet operation (the ejection operation) of the ink 9 in the inkjet head 1 is performed in such a manner, and as a result, the recording operation of images, characters, and so on to the recording paper P is performed.

(B. Functions/Advantages in Inkjet Head 1)

Then, the functions and the advantages in the inkjet head 1 according to the present embodiment will be described in detail.

(B-1. Regarding Related-Art Inkjet Head)

First, in a drive board (a flexible board) used in a general inkjet head in the related art, from a requirement of making a number of nozzle holes operate at the same time, the following is arranged. That is, an extremely large number of individual wiring lines are arranged on the flexible board from drive devices for outputting drive signals for the nozzle holes toward an actuator plate. Further, a common wiring line corresponding to the individual wiring lines is also required to be arranged on the flexible board. Since the common wiring line is the return path with respect to the individual wiring lines, it is required that, for example, the individual wiring lines and the common wiring line are coupled to the actuator plate, and the common wiring line is coupled to a power supply, the drive device, or the like at the input side through any of paths.

However, in a state in which, for example, the common wiring line is arranged in a state of not being adjacent to the individual wiring lines, there can arise a problem that a so-called drive noise appears around the wiring lines due to a current flowing through the individual wiring line and an inductance component existing in the wiring line itself. When the drive noise is high, there arises the problem of a false operation of other surrounding electronic circuits, and so on. Further, when a path of a current flowing through the common wiring line mainly exists in, for example, an end portion region of the flexible board, a difference occurs in ejection performance of ink between a nozzle hole far from the current path and a nozzle hole near thereto in some cases, there is a possibility that a deterioration in the printing quality is caused.

It can be said that in order to prevent the false operation of the electronic circuit and the deterioration in the printing quality described above, it is desirable that the common wiring line is arranged on the flexible board so as to be adjacent to the individual wiring lines, but is not eccentrically located in the end portion regions on the board. On the other hand, in the flexible board to be used in the inkjet head, when adding an extremely large solid layer in order to electrically stabilize the common wiring line, the rigidity of the flexible board increases, and therefore, handling becomes difficult when assembling the inkjet head. Therefore, a manufacturing failure is caused in some cases, and an electrical connection point (a clamping part or a connector part) becomes easy to break due to the increase in rigidity.

Due to these circumstances, it can be said that in the flexible board in the inkjet head in the related art, it becomes difficult to achieve stabilization of the operations of the inkjet head, and there is a possibility of incurring the degradation of the reliability.

(B-2. Functions/Advantages)

In contrast, in the inkjet head 1 according to the present embodiment, since the following configuration is adopted, it is possible to obtain, for example, the following functions and advantages.

Specifically, first, in each of the flexible boards 13, 13A through 13D described above, at least a part of the individual wiring region Aa including the plurality of individual wiring lines 42a and at least a part of the common wiring region Ac including the single common wiring line 42c or the plurality of common wiring lines 42c overlap each other in the overlap region Aol in the board surface.

Thus, in the present embodiment, the following is achieved unlike when such an overlap region Aol is not disposed in the board surface (when the common wiring line 42c is mainly arranged in the end portion region in the board surface as in, for example, the related-art example described above). That is, it results in that the common wiring line 42c which functions as the return path with respect to the individual wiring lines 42a is arranged in the vicinity of the individual wiring lines 42a. Therefore, in the present embodiment, since the inductance component which becomes a cause of an occurrence of such a noise (the drive noise) due to the drive of the inkjet head 1 as described above is suppressed, it is possible to achieve the stabilization of the operation of the inkjet head 1. As a result, in the present embodiment, it becomes possible to improve the reliability of the inkjet head 1.

Further, in the present embodiment, since the overlap region Aol described above is arranged including at least the vicinity of the central region A1 in the board surface (see FIG. 4), it becomes easy for the common wiring line 42c functioning as the return path described above to be arranged in the vicinity of the individual wiring lines 42a. Thus, as a result the inductance component of the wiring lines described above is further suppressed, it is possible to achieve further stabilization of the operation of the inkjet head 1, and it becomes possible to further improve the reliability.

Further, in the present embodiment, since the entire area of the individual wiring region Aa is the overlap region Aol (see FIG. 4), the effect of suppressing the inductance component of the wiring lines described above becomes more robust. As a result, the operation of the inkjet head 1 is further stabilized, and thus, it becomes possible to further improve the reliability.

In addition, in the present embodiment, when the total area Stc of the common wiring line 42c is no smaller than the total area Sta of the individual wiring lines 42a (Stc≥Sta; see FIG. 5), the following is achieved. That is, an allowable value of a current flowing through the common wiring line 42c becomes equivalent to or higher than an allowable value of a current flowing through the individual wiring lines 42a, and thus, it becomes possible to ensure a robust return path. As a result, it is possible to achieve further stabilization of the operation of the inkjet head 1, and thus, it becomes possible to further improve the reliability.

Further, in the present embodiment, when the non-arrangement region Ac2 of the common wiring line 42c is also disposed in the overlap region Aol in the common wiring region Ac in addition to the arrangement region Ac1 of the common wiring line 42c (Practical Example 2 through 4; see FIG. 7 through FIG. 9), the following is achieved. That is, the rigidity of the flexible boards 13B through 13D is suppressed compared to when only the arrangement region Ac1 of the common wiring line 42c is disposed in the overlap region Aol in the common wiring region Ac (the entire area of the common wiring region Ac is the arrangement region Ac1 of the common wiring line 42c) as in, for example, Practical Example 1 (FIG. 6). In other words, it results in that the flexibility of the flexible boards 13B through 13D is ensured, and thus, the handling easiness when assembling the inkjet head 1 is improved. As a result, it also becomes possible to enhance the convenience while suppressing the inductance component of the wiring lines described above to thereby improve the reliability.

Further, in the present embodiment, when the plurality of extending regions Ae extending along the extension direction (the Z-axis direction) of the individual wiring lines 42a is included in the arrangement region Ac1 of the common wiring line 42c described above (Practical Examples 2, 3; see FIG. 8), the following is achieved. That is, the assignment of the return path with respect to the individual wiring lines 42a is clarified, and at the same time, it becomes easy to ensure the flexibility along the extension direction (the Z-axis direction) of the individual wiring lines 42a in the flexible boards 13B, 13C. Thus, it results in that the inductance component of the wiring lines described above is further suppressed, and at the same time, the handling easiness when assembling the inkjet head 1 is further enhanced. As a result, it becomes possible to further enhance the convenience while further improving the reliability.

In addition, in the present embodiment, when the plurality of extending regions Ae described above includes the regions individually overlapping the plurality of individual wiring lines 42a as the overlap region Aol (Practical Example 3; see FIG. 8), the following is achieved. That is, since distances between the return path described above and the individual wiring lines 42a are set shorter, it results in that the inductance component of the wiring lines described above is further more suppressed. As a result, it becomes possible to achieve further enhancement of the convenience while improving the reliability.

Further, in the present embodiment, when the number of the extending regions Ae described above is made smaller than the number of the individual wiring lines 42a, and at the same time, the total width in the plurality of extending regions Ae is made larger than the total width in the plurality of individual wiring lines 42a (Practical Example 2; see FIG. 7), the following is achieved. That is, due to the suppression of the inductance component of the wiring lines described above, it becomes easier to ensure the flexibility along the extension direction (the Z-axis direction) of the individual wiring lines 42a while improving the reliability. As a result, the handling easiness when assembling the inkjet head 1 is further enhanced, and thus, it becomes possible to achieve further enhancement of the convenience.

Further, in the present embodiment, when the region (the net-like region Am) in which the common wiring line 42c is arranged like a net is included in the arrangement region Ac1 of the common wiring line 42c described above (Practical Example 4; see FIG. 9), it results in that the common wiring line 42c is evenly arranged in the arrangement region Ac1 of the common wiring line 42c. Thus, it is arranged that the return path with respect to the individual wiring lines 42a is also assigned evenly, and therefore, it results in that the inductance component of the wiring lines described above is further suppressed, and at the same time, the rigidity of the flexible board 13D is further suppressed, and thus, the handling easiness when assembling the inkjet head 1 is further enhanced. As a result, it becomes possible to further enhance the convenience while further improving the reliability.

In addition, in the present embodiment, since the first wiring layer and the second wiring layer out of the plurality of wiring layers described above are arranged adjacent to each other along the direction (the Y-axis direction) perpendicular to the board surface in the flexible board 13, the following is achieved. That is, it is possible to set the loop path formed of the individual wiring lines 42a and the common wiring line 42c to the shortest while increasing the wiring density of the individual wiring lines 42a. As a result, it is possible to achieve further stabilization of the operation of the inkjet head 1, and thus, it becomes possible to further improve the reliability.

2. Modified Examples

Then, some modified examples (Modified Example 1 and Modified Example 2) of the embodiment described above will be described. It should be noted that hereinafter, the same constituents as those in the embodiment are denoted by the same reference symbols, and the description thereof will arbitrarily be omitted.

Modified Example 1

(A. Configuration)

Figure 10:
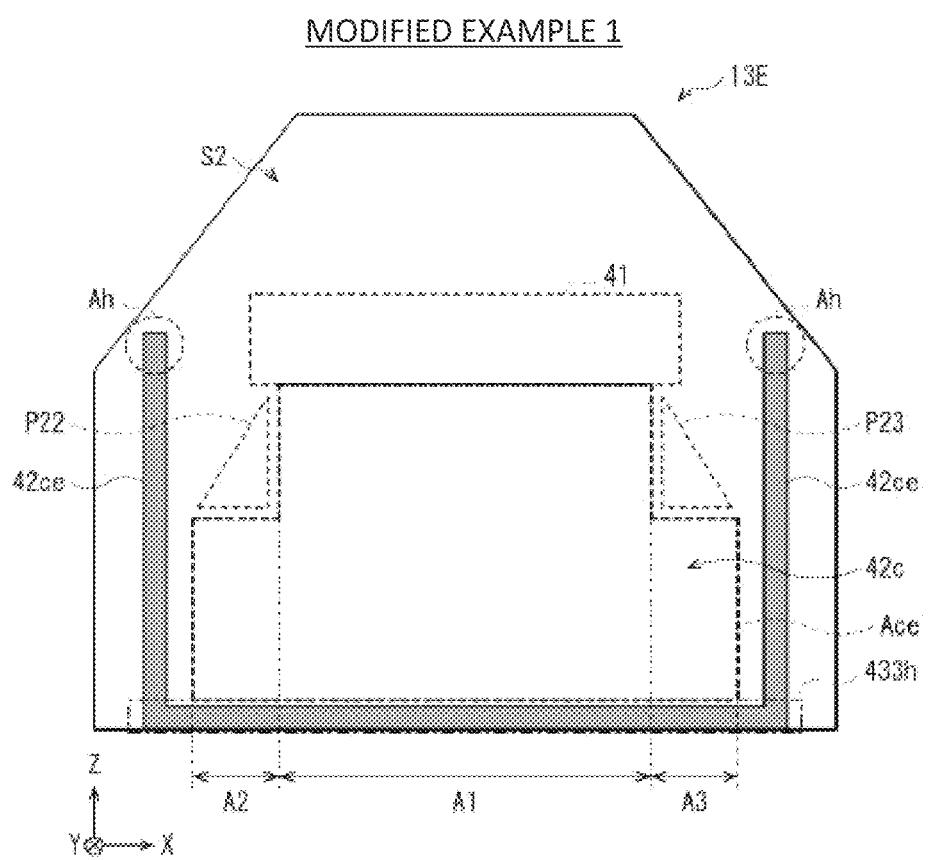
FIG. 10 is a plan view schematically showing a configuration example of a common wiring region and so on related to Modified Example 1.

FIG. 10 is a plan view (a Z-X plane view) schematically showing a configuration example (a configuration example on the reverse surface S2) of the common wiring region Ac and so on in a flexible board 13E according to Modified Example 1.

In the flexible board 13E according to Modified Example 1 described above, first, the overlap region Aol between the individual wiring region Aa and the common wiring region Ac is arranged including at least the vicinity of the central region A1 in the board surface similarly to the flexible board 13 (see FIG. 5) according to the embodiment. Specifically, in the flexible board 13E, similarly to the flexible board 13, such an overlap region Aol is arranged so as to include the central region A1, and the end portion regions A2, A3.

It should be noted that in the flexible board 13E, unlike the flexible board 13, the area SAc of the common wiring region Ac is made smaller than the area SAa of the individual wiring region Aa (SAc<SAa), and at the same time, a part of the individual wiring region Aa fails to be the overlap region Aol. Specifically, in the example shown in FIG. 10, some regions (regions represented by the reference symbols P22, P23 in FIG. 10) in the vicinity of the both end portions along the X-axis direction in the individual wiring region Aa are excluded from the end portion regions A2, A3 in the overlap region Aol described above. This is because, while the common wiring region Ac (see FIG. 5) in the flexible board 13 has the substantially rectangular shape (the trapezoidal shape), the common wiring region Ac in the flexible board 13E has a stepped shape lacking some parts (the regions represented by the reference symbols P22, P23) in such a trapezoidal shape.

(B. Functions/Advantages)

Also in the flexible board 13E according to Modified Example 1 having such a configuration, it is possible to obtain basically the same advantages due to substantially the same function as that of the flexible board 13 according to the embodiment.

It should be noted that unlike the embodiment and Modified Example 1, it is possible to arrange that, for example, the overlap region Aol fails to include the central region A1 described above. Specifically, providing at least a part of the individual wiring region Aa and at least a part of the common wiring region Ac overlap each other in the board surface, it is possible to arbitrarily set the shape, the size, and so on of the overlap region Aol.

Modified Example 2

(A. Configuration)

Figure 11:
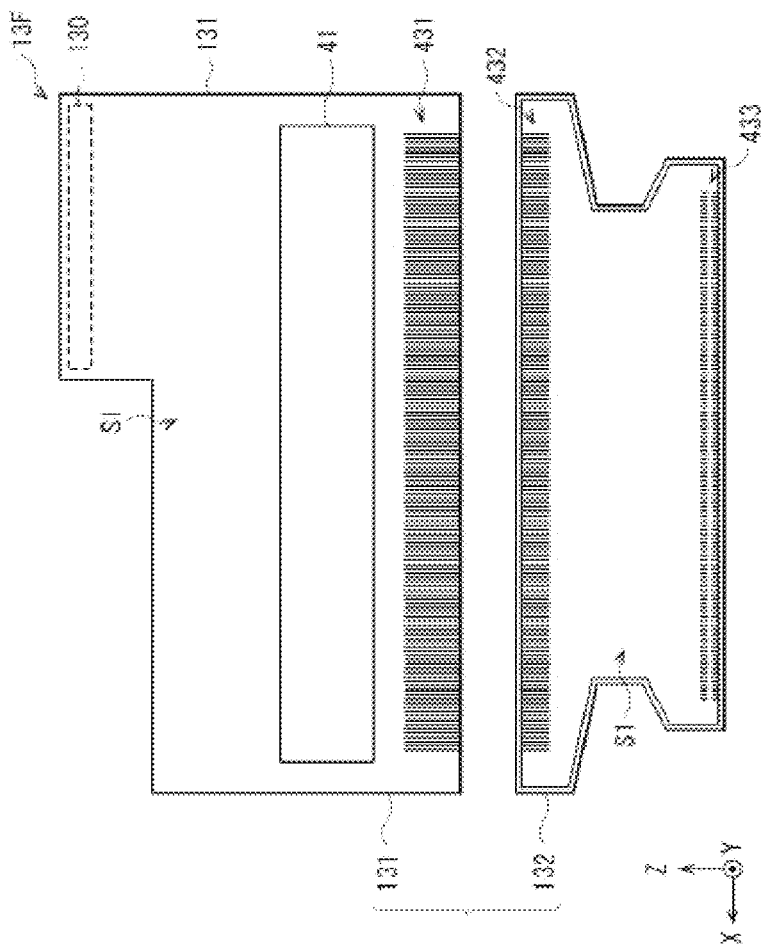
FIG. 11 is a plan view schematically showing a configuration example of a flexible board according to Modified Example 2.

FIG. 11 is a plan view (a Z-X plane view) schematically showing a configuration example (a configuration example at the obverse surface S1 side) of a flexible board 13F according to Modified Example 2. Specifically, in FIG. 11, the configuration example of the flexible board 13F according to Modified Example 2 is shown in a schematically exploded state. It should be noted that a plane configuration example of a pressure-bonding electrode part 432 described later shown in FIG. 11 is shown as an arrangement configuration viewed in a see-through manner from the obverse surface S1 side for the sake of convenience in order to make the correspondence relationship with the plane configuration example of a pressure-bonding electrode part 431 described later easy to understand. Further, in FIG. 11, a variety of wiring lines (wiring lines for transmitting the drive signals Sd and so on) on the flexible board 13F (a first flexible board 131 and a second flexible board 132 described later) are omitted from the illustration for the sake of convenience.

As shown in FIG. 11, the flexible board 13F according to Modified Example 2 is formed of the two flexible boards (the first flexible board 131 and the second flexible board 132) arranged along a transmission direction (the Z-axis direction) of the drive signals Sd. The first flexible board 131 is arranged at the I/F board 12 side, and the second flexible board 132 is arranged at the jet section 11 side.

The first flexible board 131 is a board (a mounting board) on which the drive device 41 is mounted at the obverse surface S1 side. In contrast, the second flexible board 132 is a board (a relay board) for transmitting the drive signals Sd while relaying the drive signals Sd from the first flexible board 131 toward the jet section 11.

(First Flexible Board 131)

As shown in FIG. 11, the first flexible board 131 is provided with the coupling electrodes 130 described above, the drive device 41 described above, and the pressure-bonding electrode part 431.

The coupling electrodes 130 are arranged in the end portion region at the I/F board 12 side in the first flexible board 131, and are electrodes for electrically coupling the first flexible board 131 and the I/F board 12 to each other.

The pressure-bonding electrode part 431 is arranged in the end portion region at the jet section 11 side (the second flexible board 132 side) at the obverse surface S1 side of the first flexible board 131. The pressure-bonding electrode part 431 is arranged to achieve electrical coupling to the pressure-bonding electrode part 432 described later in the second flexible board 132 with, for example, thermocompression bonding using the ACF described above.

(Second Flexible Board 132)

As shown in FIG. 11, the second flexible board 132 is provided with the pressure-bonding electrode part 432 and the pressure-bonding electrode part 433.

The pressure-bonding electrode part 432 is arranged in the end portion region at the first flexible board 131 side at the reverse surface S2 side of the second flexible board 132. The pressure-bonding electrode part 432 is arranged to be pressure-bonded (thermocompression-bonded) to the pressure-bonding electrode part 431 on the first flexible board 131 to electrically be coupled to each other in such a manner as described above. It should be noted that the drive signals Sd transmitted from the pressure-bonding electrode part 431 via the pressure-bonding electrode part 432 are arranged to be transmitted toward the jet section 11 (the pressure-bonding electrode part 433) on the second flexible board 132.

The pressure-bonding electrode part 433 is arranged in the end portion region at the jet section 11 side at the obverse surface S1 side of the second flexible board 132. As described above, the pressure-bonding electrode part 433 is arranged to be pressure-bonded (e.g., thermocompression-bonded using the ACF described above) to the jet section 11 to electrically be coupled to each other. It should be noted that the drive signals Sd transmitted via the pressure-bonding electrode part 433 are arranged to be transmitted toward the jet section 11 (the drive electrodes in the actuator plate 111 described above).

Here, also in the flexible board 13F having such a configuration, the overlap region Aol described above is disposed similarly to the flexible boards 13, 13A through 13E described hereinabove. Specifically, in the first flexible board 131 and the second flexible board 132 described above, the overlap regions Aol are respectively disposed.

It should be noted that it is also possible to arrange that the overlap regions Aol different in type from each other in, for example, Practical Examples 1 through 4 are disposed as the overlap region Aol on the first flexible board 131 and the overlap region Aol on the second flexible board 132, respectively. In this case, for example, regarding the overlap region Aol on the second flexible board 132, it is desirable to select the overlap region Aol so that the rigidity of the second flexible board 132 becomes relatively low. In contrast, regarding the overlap region Aol on the first flexible board 131, there is no problem when selecting the overlap region Aol so that the rigidity of the first flexible board 131 becomes relatively high.

(B. Functions/Advantages)

Also in the flexible board 13F according to Modified Example 2 having such a configuration, it is possible to obtain basically the same advantages due to substantially the same function as that of the embodiment and Modified Example 1.

3. Other Modified Examples

The present disclosure is described hereinabove citing the embodiment, some practical examples, and some modified examples, but the present disclosure is not limited to the embodiment and so on, and a variety of modifications can be adopted.

For example, in the embodiment and so on described above, the description is presented specifically citing the configuration examples (the shapes, the arrangements, the number, and so on) of each of the members in the printer and the inkjet head, but those described in the above embodiment and so on are not limitations, and it is possible to adopt other shapes, arrangements, numbers and so on.

Specifically, for example, in the embodiment and so on described above, the description is presented specifically citing the configuration examples (the shapes, the arrangements, the number, and so on) of the flexible boards (the drive boards), the drive devices, a variety of wiring lines, and so on, but these configuration examples are not limited to those described in the above embodiment and so on. For example, in the embodiment and so on described above, there is described the example when the plurality of drive boards is disposed inside the inkjet head, but this example is not a limitation, and it is possible to arrange that, for example, just one drive board is disposed alone inside the inkjet head. Further, in the embodiment and so on described above, there is described the example when the single drive device is disposed on the drive board, but this example is not a limitation, and it is possible to arrange that, for example, a plurality of drive devices is disposed on the drive board. Further, in the embodiment and so on described above, the shape of the drive device is assumed to be the rectangular shape, but this example is not a limitation, and the shape of the drive device can be, for example, a square shape. In addition, in the embodiment and so on described above, there is described the example when the drive devices are mounted on the board surface in each of the drive boards using the flip-chip mounting, but this example is not a limitation, and it is possible to arrange that, for example, the drive devices are mounted on the board surface using other mounting methods (insertion mounting with solder, surface mounting, wire bonding mounting, and so on).

Further, the numerical examples of the variety of parameters described in the embodiment and so on described above are not limited to the numerical examples described in the embodiment and so on, and can also be other numerical values.

Further, a variety of types of structures can be adopted as the structure of the inkjet head. Specifically, it is possible to adopt, for example, a so-called side-shoot type inkjet head which ejects the ink 9 from a central portion in the extension direction of each of the ejection channels in the actuator plate 111. Alternatively, it is possible to adopt, for example, a so-called edge-shoot type inkjet head for ejecting the ink 9 along the extension direction of each of the ejection channels. Further, the type of the printer is not limited to the type described in the embodiment and so on described above, and it is possible to apply a variety of types such as an MEMS (Micro Electro-Mechanical Systems) type.

Further, for example, it is possible to apply the present disclosure to either of an inkjet head of a circulation type which uses the ink 9 while circulating the ink 9 between the ink tank and the inkjet head, and an inkjet head of a non-circulation type which uses the ink 9 without circulating the ink 9.

Further, the series of processing described in the above embodiment and so on can be arranged to be performed by hardware (a circuit), or can also be arranged to be performed by software (a program). When arranging that the series of processing is performed by the software, the software is constituted by a program group for making the computer perform the functions. The programs can be incorporated in advance in the computer described above to be used by the computer, for example, or can also be installed in the computer described above from a network or a recording medium to be used by the computer.

Further, in the embodiment and so on described above, the description is presented citing the printer 5 (the inkjet printer) as a specific example of the "liquid jet recording device" in the present disclosure, but this example is not a limitation, and it is also possible to apply the present disclosure to other devices than the inkjet printer. In other words, it is also possible to arrange that the "liquid jet head" (the inkjet head) of the present disclosure is applied to other devices than the inkjet printer. Specifically, it is also possible to arrange that the "liquid jet head" of the present disclosure is applied to a device such as a facsimile or an on-demand printer.

In addition, it is also possible to apply the variety of examples described hereinabove in arbitrary combination.

It should be noted that the advantages described in the present specification are illustrative only, but are not a limitation, and other advantages can also be provided.

Further, the present disclosure can also take the following configurations.

<1> A flexible board configured to output a drive signal to be applied to a liquid jet head having a jet section, the flexible board comprising: a first wiring layer and a second wiring layer opposed to each other along a direction perpendicular to a board surface of the flexible board; at least one drive device which is arranged on the first wiring layer, and which is configured to generate the drive signal configured to jet liquid from the jet section; an individual wiring region which is arranged in the first wiring layer, and which includes a plurality of individual wiring lines configured to individually transmit the drive signal from the drive device toward a plurality of individual electrodes in the jet section; a common wiring region which is arranged in the second wiring layer, and which includes at least one common wiring line electrically coupled to a common electrode in the jet section; a pressure-bonding electrode part which is arranged closed to the jet section than the individual wiring region and the common wiring region in the board surface, and which includes a plurality of pressure-bonding electrodes electrically coupled individually to the plurality of individual wiring lines and the at least one common wiring line; and an overlap region in which at least a part of the individual wiring region and at least a part of the common wiring region overlap each other in the board surface.

<2> The flexible board according to <1>, wherein the plurality of individual wiring lines is arranged side by side along a longitudinal direction of the drive device, and the overlap region is arranged so as to include at least a central region along the longitudinal direction in the board surface.

<3> The flexible board according to <2>, wherein an area of the common wiring region is larger than an area of the individual wiring region, and an entire area of the individual wiring region forms the overlap region.

<4> The flexible board according to <3>, wherein a total area of the common wiring line in the common wiring region is no smaller than a total area of the individual wiring lines in the individual wiring region.

<5> The flexible board according to any one of <1> to <4>, wherein the overlap region in the common wiring region has an arrangement region of the common wiring line and a non-arrangement region of the common wiring line.

<6> The flexible board according to <5>, wherein the plurality of individual wiring lines is arranged side by side along the longitudinal direction of the drive device, and the arrangement region of the common wiring line includes a plurality of extending regions which extends along an extension direction of the individual wiring line, and which is arranged side by side along the longitudinal direction.

<7> The flexible board according to <6>, wherein the plurality of extending regions includes regions which individually overlap the plurality of individual wiring lines, as the overlap region.

<8> The flexible board according to <6>, wherein a number of the extending regions is smaller than a number of the individual wiring lines, and a total width along the longitudinal direction in the plurality of extending regions is larger than a total width along the longitudinal direction in the plurality of individual wiring lines.

<9> The flexible board according to <5>, wherein the arrangement region of the common wiring line includes a region in which the common wiring line is arranged to have a net-like shape.

<10> The flexible board according to any one of <1> to <9>, wherein a plurality of wiring layers including the first wiring layer and the second wiring layer is opposed to each other along the direction perpendicular to the board surface, and the first wiring layer and the second wiring layer are arranged so as to be adjacent to each other along the direction perpendicular to the board surface.

<11> A liquid jet head comprising the flexible board according to any one of <1> to <10>; and the jet section configured to jet the liquid based on the drive signal output from the flexible board.

<12> A liquid jet recording device comprising the liquid jet head according to <11>.

What is claimed is:

1. A flexible board configured to output a drive signal to be applied to a liquid jet head having a jet section, the flexible board comprising:
   a first wiring layer and a second wiring layer opposed to each other along a direction perpendicular to a board surface of the flexible board;
   at least one drive device which is arranged on the first wiring layer, and which is configured to generate the drive signal configured to jet liquid from the jet section;
   an individual wiring region which is arranged in the first wiring layer, and which includes a plurality of individual wiring lines configured to individually transmit the drive signal from the drive device toward a plurality of individual electrodes in the jet section;
   a common wiring region which is arranged in the second wiring layer, and which includes at least one common wiring line electrically coupled to a common electrode in the jet section;
   a pressure-bonding electrode part which is arranged closed to the jet section than the individual wiring region and the common wiring region in the board surface, and which includes a plurality of pressure-bonding electrodes electrically coupled individually to the plurality of individual wiring lines and the at least one common wiring line; and
   an overlap region in which at least a part of the individual wiring region and at least a part of the common wiring region overlap each other in the board surface, wherein:
   an area of the common wiring region is larger than an area of the individual wiring region, and
   an entire area of the individual wiring region forms the overlap region.

2. The flexible board according to claim 1, wherein the plurality of individual wiring lines is arranged side by side along a longitudinal direction of the drive device.

3. The flexible board according to claim 1, wherein
   a total area of the common wiring line in the common wiring region is no smaller than a total area of the individual wiring lines in the individual wiring region.

4. The flexible board according to claim 1, wherein
   the overlap region in the common wiring region has an arrangement region of the common wiring line and a non-arrangement region of the common wiring line.

5. The flexible board according to claim 4, wherein
   the plurality of individual wiring lines is arranged side by side along the longitudinal direction of the drive device, and the arrangement region of the common wiring line includes a plurality of extending regions which extends along an extension direction of the individual wiring line, and which is arranged side by side along the longitudinal direction.

6. The flexible board according to claim 5, wherein the plurality of extending regions includes regions which individually overlap the plurality of individual wiring lines, as the overlap region.

7. The flexible board according to claim 5, wherein a number of the extending regions is smaller than a number of the individual wiring lines, and a total width along the longitudinal direction in the plurality of extending regions is larger than a total width along the longitudinal direction in the plurality of individual wiring lines.

8. The flexible board according to claim 4, wherein the arrangement region of the common wiring line includes a region in which the common wiring line is arranged to have a net-like shape.

9. The flexible board according to claim 1, wherein a plurality of wiring layers including the first wiring layer and the second wiring layer is opposed to each other along the direction perpendicular to the board surface, and the first wiring layer and the second wiring layer are arranged so as to be adjacent to each other along the direction perpendicular to the board surface.

10. A liquid jet head comprising:

the flexible board according to claim 1; and the jet section configured to jet the liquid based on the drive signal output from the flexible board.

11. A liquid jet recording device comprising the liquid jet head according to claim 10.

* * * * *